(12) United States Patent
Aratani et al.

(10) Patent No.: US 8,476,618 B2
(45) Date of Patent: Jul. 2, 2013

(54) ORGANIC ELECTROLUMINESCENT DISPLAY DEVICE

(75) Inventors: Sukekazu Aratani, Hitachiota (JP); Hiroshi Sasaki, Mito (JP); Kazuhito Masuda, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 70 days.

(21) Appl. No.: 12/809,792

(22) PCT Filed: Dec. 19, 2008

(86) PCT No.: PCT/JP2008/003857
§ 371 (c)(1), (2), (4) Date: Jun. 21, 2010

(87) PCT Pub. No.: WO2009/081559
PCT Pub. Date: Jul. 2, 2009

(65) Prior Publication Data
US 2010/0276687 A1  Nov. 4, 2010

(30) Foreign Application Priority Data

Dec. 21, 2007  (JP) .................................. 2007-329482

(51) Int. Cl.
*H01L 29/08* (2006.01)
*H01L 35/24* (2006.01)
*H01L 51/00* (2006.01)

(52) U.S. Cl.
USPC .............................. 257/40; 257/79; 257/103

(58) Field of Classification Search
USPC ................... 257/40, 43, 79, 88, 89, 102, 103, 257/E51.001, E51.003, E51.018, E51.024, 257/E51.046, E51.048, E51.049, E51.05, 257/E51.051, E51.514, 73; 438/29, 45, 99, 438/104, 608, 609, 648, 780, 785, FOR. 135
See application file for complete search history.

(56) References Cited

U.S. PATENT DOCUMENTS 8,227,092 B2    7/2012  Park et al.
2003/0201716 A1*  10/2003  Yamazaki et al. ............ 313/506
(Continued)

FOREIGN PATENT DOCUMENTS

EP  1 753 047 A2  2/2007
JP  2005-104026   4/2005
(Continued)

OTHER PUBLICATIONS

Rico Meerheim et al.; Ultrastable and efficient red organic light emitting diodes with doped transport layers, Applied Physics Letters 89, 061111, Published online Aug. 9, 2006.

(Continued)

*Primary Examiner* — Olik Chaudhuri
*Assistant Examiner* — Quovaunda V Jefferson
(74) *Attorney, Agent, or Firm* — Antonelli, Terry, Stout & Kraus, LLP.

(57) ABSTRACT

To provide an organic electroluminescent display device including an organic electroluminescent layer that can be easily fabricated under an atmosphere containing oxygen and which can achieve high efficiency. An organic electroluminescent display device includes a substrate, an organic electroluminescent layer, an upper electrode and a lower electrode sandwiching therein the organic electroluminescent layer, either one of the upper and lower electrodes being a transparent electrode, and the other being a reflecting electrode, and a charge transport layer disposed between the organic electroluminescent layer and the substrate. The charge transport layer is photo-cured by light with a wavelength longer than that of a near-ultraviolet light.

5 Claims, 3 Drawing Sheets

U.S. PATENT DOCUMENTS

| | | | |
|---|---|---|---|
| 2006/0046094 A1* | 3/2006 | Nishino et al. | 428/690 |
| 2006/0159842 A1* | 7/2006 | Gupta et al. | 427/66 |
| 2006/0284169 A1 | 12/2006 | Park et al. | |
| 2007/0029556 A1 | 2/2007 | Su et al. | |
| 2007/0071885 A1 | 3/2007 | Kumagai | |
| 2007/0166855 A1* | 7/2007 | Lee et al. | 438/29 |
| 2008/0188637 A1* | 8/2008 | Rieke | 528/378 |

FOREIGN PATENT DOCUMENTS

| | | |
|---|---|---|
| JP | 2006-131780 | 5/2006 |
| JP | 2006-351543 | 12/2006 |
| JP | 2007-049153 | 2/2007 |
| JP | 2007-095512 | 4/2007 |
| JP | 2007-095595 | 4/2007 |
| JP | 2007-201462 | 8/2007 |
| JP | 2007-242910 | 9/2007 |
| JP | 2007-324033 | 12/2007 |

OTHER PUBLICATIONS

N. Akino et al.; Development of New Materials in Polymer Light Emitting Diodes, IDW' 06, pp. 441-443.

Communication mailed Jul. 31, 2012, for Japanese Application No. 2007-329482; 3 Pages; Japanese Patent Office, Japan.

* cited by examiner

ORGANIC ELECTROLUMINESCENT DISPLAY DEVICE

TECHNICAL FIELD

The present invention relates to organic electroluminescent display devices.

BACKGROUND ART

In recent years, organic electroluminescent display devices have drawn attention as a next generation flat display device. The organic electroluminescent display device has excellent characteristics, including a light-emitting property, a wide viewing angle, and high-speed response. An organic electroluminescent element includes, by way of example, an organic layer, and a reflecting electrode with a low work function which are formed over a glass substrate. The organic layer includes a transparent electrode made of ITO or the like, a hole transport layer, an electroluminescent layer, an electron transport layer, and the like. An emitted light passes through the electrode and is taken out of a back surface of the substrate.

The organic electroluminescent display devices can have achieved high efficiency and a long lifetime by forming each organic layer by a vacuum deposition method. For example, R. Meerheim et. al discloses in a non-patent document 1 that a red organic electroluminescent element can be fabricated by the vacuum deposition method so as to have a half-life period of brightness of one and a half million hours or more at an initial brightness of 500 cd/m$^2$.

On the other hand, a method for fabricating an organic electroluminescent display device without using the vacuum deposition method includes formation of an organic layer by a spin coat method, or by an ink jet method. The formation of the organic layer using a printing method, such as the ink jet method, can eliminate the necessity of an metal mask required for formation of the organic layer using the vapor deposition method. Thus, the organic electroluminescent display device can be fabricated more easily.

Such an organic electroluminescent display device fabricated by a wet process has short lifetime and efficiency as compared to the organic electroluminescent element formed by the vacuum deposition method. Non-patent Document 2 discloses that a red organic electroluminescent element fabricated using polymer material by the spin coat method has a lifetime of about a hundred thousand hours at an initial brightness of 500 cd/m$^2$.

The organic electroluminescent element has a multilayer laminated structure. As a method for forming the multilayer laminated structure every pixel using a solution, Patent Document 1 discloses a method using a water repellent bank. This method forms a film in a pixel in such a manner that the solution is not formed on the bank by making the surface of the bank layer water repellent. Then, the water repellency of the bank surface is not eliminated by a drying process under inert atmosphere during a film formation process, so that the film formation process can be continuously performed without disturbing the position of formation of the film.
Patent Document 1: JP-A-2007-95512
Non-Patent Document 1: Appl. Phys. Lett., 89, 061111 (2006)
Non-Patent Document 2: IDW' 06, p. 441 (2006)

DISCLOSURE OF THE INVENTION

Problems to be Solved by the Invention

Drying the film printed under inert atmosphere as disclosed in Patent Document 1 can form the laminated structure without degrading the water repellency of the surface of the bank. The film formation, however, should be carried out under the inert atmosphere, which puts serious restrictions on the fabrication.

If a fabrication machine can be set under an atmosphere containing oxygen, a fabrication process will be made more easily. Accordingly, it is an object of the present invention to obtain an organic electroluminescent display device having an organic layer which can be formed under an atmosphere containing oxygen.

Means for Solving the Problems

An organic electroluminescent display device includes a substrate, an organic electroluminescent layer, an upper electrode and a lower electrode sandwiching therein the organic electroluminescent layer, either one of the upper and lower electrodes being a transparent electrode, and the other being a reflecting electrode, and a charge transport layer disposed between the organic electroluminescent layer and the substrate.

A bank layer subjected to a water repellent process is provided between the lower electrode and the upper electrode. The bank layer subjected to the water repellent process is necessary so as to form an organic film in a desired pixel in forming the organic film using a solution by a wet process.

The invention of the present application so as to achieve the above object is characterized by that the charge transport layer is formed of material which is photo-cured by light with a wavelength equal to or longer than that of a near-ultraviolet light. The term "light with a wavelength equal to or longer than that of a near-ultraviolet light" as used herein means the so-called UV-A (315 to 400 nm) and visible light, that is, the light whose wavelength is equal to or more than 315 nm.

The charge transport layer preferably uses, specifically, a photoinitiator that starts curing by the long-wavelength light. For example, the photoinitiator is preferably a curing agent containing an onium salt, tosylate, phosphorus, sulfur, or iodine, which can be mixed in use.

The onium salts include 4-hydroxyphenyl dimethyl sulfonium p-toluenesulfonate, 4-hydroxyphenyl dimethyl sulfonium hexafluoroantimonate, and the like. The tosylates include nitrobenzyl tosylate, such as 2,6-dinitrobenzyl tosylate, and benzoin tosylate. The curing agents containing phosphorus include diphenyl(2,4,6-methylbenzoyl) phosphine oxide, bis(2,4,6-trimethylbenzoyl) phosphine oxide, and the like.

The curing agents containing iodine include diphenyl iodonium p-toluenesulfonate, diphenyl iodonium hexafuluoroantimonat, and the like. The compounds for serving to transport charges include an oxide of Ti, Ce, Nd, or Zr. A lipophilic smectite is preferably mixed into the above material to uniformize the oxide film so as to solve inconveniences, including cracks or the like.

The charge transport layer made of the material photo-cured by the long-wavelength light does not generate ozone even when the light with a wavelength equal to or longer than that of the near-ultraviolet light is applied thereto in air in curing the charge transport layer material. Thus, the water repellency of the surface of the bank can be prevented from being degraded due to ozone generated. It is apparent that the light with the wavelength in this range does not cut a C—F bond which makes the bank surface water repellent.

Thus, the water repellency of the bank surface can be maintained even after formation of the charge transport layer, and further the following formation of the electroluminescent layer can use the water repellency of the bank surface. The charge transport layer photo-cured has reduced solubility in a solvent, so that the electroluminescent layer can be formed thereover by the wet process.

The radiation of the light with a wavelength equal to or longer than that of the near-ultraviolet light under an atmosphere containing oxygen does not generate ozone, and does not decompose ozone. Obviously, the C—F bond which makes the bank surface water repellent is not cut. Thus, the water repellency of the bank surface is not damaged, whereby the charge transport layer can be formed.

The organic electroluminescent display device of the invention can be applied to any one of the top emission type with the transparent electrode serving as the upper electrode, and the bottom emission type with the transparent electrode serving as the lower electrode.

A method for fabricating an organic electroluminescent display device so as to achieve the above object of the invention involves forming a reflecting electrode, a charge transport layer, an organic electroluminescent layer, and a transparent electrode over a substrate in that order. The method includes the step of photo-curing the charge transport layer by light with a wavelength equal to or longer than that of a near-ultraviolet light.

Effect of the Invention

This arrangement can provide an organic electroluminescent display device having an organic layer which can be formed under an atmosphere containing oxygen, and can also simplify a fabrication process of the organic electroluminescent display device.

Figure 1:
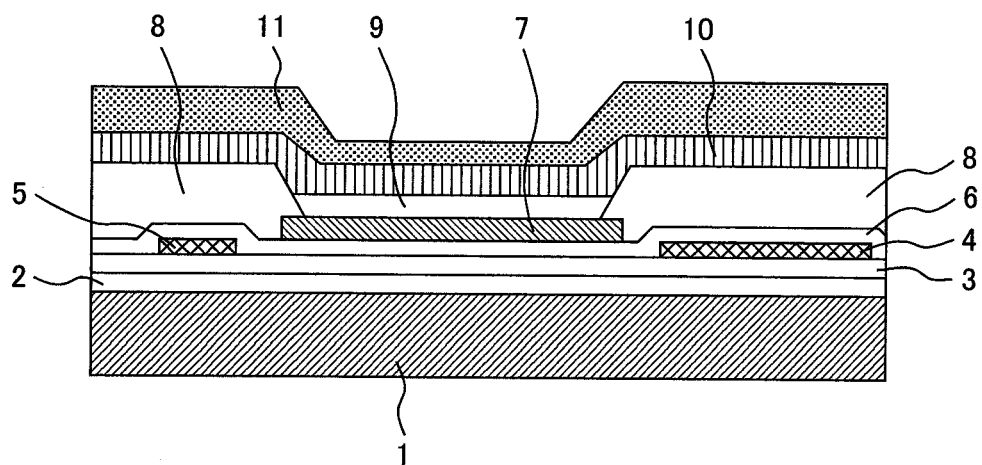
FIG. 1 is a cross-sectional view of a pixel of an organic electroluminescent display device in one embodiment according to the invention.

DESCRIPTION OF REFERENCE NUMERALS 1, 21, 51 glass substrate
2, 22, 52 first interlayer insulating film
3, 23, 53 second interlayer insulating film
4, 24, 54 power line
5, 25, 55 image signal line
6, 26, 56 third interlayer insulating film
7, 32, 62 transparent electrode
8, 29, 59 bank
9, 30, 60 organic EL layer
10, 31 electron injection layer
11 upper electrode
12, 41, 61 hole injection layer
13, 42, 73 hole transport layer
14, 43, 72 organic electroluminescent layer
27, 57 planarizing layer
28, 58 lower electrode
71 electron transport layer

BEST MODE FOR CARRYING OUT THE INVENTION

The following will describe in more detail an organic electroluminescent display device according to preferred embodiments of the invention.

First Embodiment

FIG. 1 is a cross-sectional view showing a structural example of a pixel of a bottom emission type organic electroluminescent display device for taking out emitted light from a lower electrode side. FIG. 1 shows a structure in which a first interlayer insulating film 2, a second interlayer insulating film 3, a power line 4, an image signal line 5, a third interlayer insulating film 6, a transparent electrode (lower electrode) 7, a bank 8, an organic EL layer 9, an electron injection layer 10, and an upper electrode 11 are arranged over a glass substrate 1 in that order.

Figure 2:
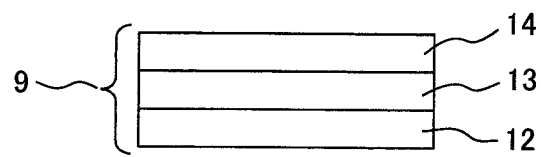
FIG. 2 is a cross-sectional view of an organic EL layer positioned at the center of the pixel shown in FIG. 1.

FIG. 2 shows a cross-sectional structure of the center of the pixel of the organic EL layer 9, which includes a hole injection layer 12, a hole transport layer 13, and an organic electroluminescent layer 14 formed in that order from the bottom.

This embodiment is characterized by that the hole transport layer 13 is formed of material which is photo-cured by light with a wavelength equal to or longer than that of a near-ultraviolet light.

The transparent electrode 7 can be formed of material having transparency and a high work function. The materials for the electrode 7 include anode materials, for example, conductive oxides, such as indium zinc oxide (IZO), in addition to indium tin oxide (ITO), and metal or the like having a large work function (thin Ag layer), or the like. This embodiment employs the transparent electrode 7. The patterning of the transparent electrode can be performed using photolithography.

The bank 8 can be formed using various kinds of resins, such as polyimide resin, or acrylate resin. In this embodiment, the photosensitive polyimide resin is used. After being applied, the bank 8 can be formed by exposure and development using a predetermined photomask. The water repellent process is applied to the surface of the bank. For example, the plasma process using fluorinated gas is applied to the surface of the bank to fluorinate the bank surface, causing the water repellent process.

The hole injection layer 12 can be formed using polypyrrole material, triphenylamine polymer material, and the like. In this embodiment, materials for the layer 12 include poly (3,4-ethylene dioxythiophene) (PEDOT), and polystyrene sulfonate (PSS). The hole injection layer 12 is formed using the ink jet method. Since the water repellent process is applied to the bank surface, the hole injection layer can be provided only over the transparent electrode.

The hole transport layer 13 includes polymer, a crosslinking agent, and a photopolymerization initiator. The polymers include, for example, various kinds of polymers, such as an arylamine-based polymer, a polyfluorene-based polymer, a polyparaphenylene-based polymer, a polyarylene-based polymer, or a polycarbazole-based polymer. The crosslinking agents include, for example, an oxetane-based compound, an epoxy-based compound, a vinyl ether-based compound, and the like. In this embodiment, the arylamine-based polymer is used as the polymer. The oxetane-based compound is used as the crosslinking agent. A triaryl sulfonium salt which is an onium salt is used as the photopolymerization initiator.

A solution containing the above materials is applied using an ink jet method to form the hole transport layer. Since the water repellent process is applied to the bank surface, the hole transport layer can be formed only over the hole injection layer. The hole transport layer is subjected to irradiation of the light with a wavelength equal to or longer than a near-ultraviolet light to cause a polymerization reaction, and then becomes insoluble. The polymerization reaction can be performed by the light irradiation in the presence of air.

The organic electroluminescent layer 14 can be formed using polymers, such as a polyfluorene-based polymer, a polyparaphenylene-based polymer, a polyarylene-based polymer, or a polycarbazole-based polymer, or the so-called dendrimer type material having both functions of luminescent material and charge transport material.

Further, the organic electroluminescent layer 14 can be made using the so-called low-molecular material. In this case, a carbazole derivative, a fluorene derivative, or the like is preferably used as a host material. Further, a dopant in use can be an Ir or Pt complex or the like. Such a dopant can be used to be dispersed into the above luminescent polymer. In this embodiment, a polyfluorene polymer is used for the organic electroluminescent layer.

Since the water repellency of the bank is maintained, the organic electroluminescent layer is formed of a solution using an ink jet method, so that the organic electroluminescent layer can be provided only on the hole transport layer.

The electron injection layer 10 is a layer for supplying electrons to the organic electroluminescent layer 14. Materials for the electron injection layer 10 in use can be Ba, LiF, Ca, and a lamination thereof, a simple substance, such as a tris(8-quinolinolato) aluminum derivative, an oxadiazole derivative, a triazole derivative, a fullerene derivative, a phenanthroline derivative, or a quinoline derivative, and the material doped with alkali metal, a tetrathiafulvalene derivative, a pyrroline B, or the like.

In this embodiment, the electron injection layer 10 is formed over the entire substrate by a vacuum deposition method using barium as a material.

Al is used for the upper electrode 11. Material for the electrode is not limited thereto, and a MgAg alloy, Ag, or the like can also be in use.

With the above arrangement, the hole injection layer, the hole transport layer, and the organic electroluminescent layer can be provided only over the transparent electrode.

Comparative Example 1

As a comparative example, the photopolymerization initiator contained in the hole transport layer 13 of the above embodiment is changed to 1-hydroxy-cyclohexyl-phenyl-ketone. Light curing among formation processes of the above hole transport layer 13 is performed by applying ultraviolet light (UV-C) having a wavelength of about 250 nm under oxygen atmosphere. As a result, the water repellency of the surface of the bank is degraded. When the organic electroluminescent layer 14 is formed by the ink jet method, the organic electroluminescent layer would also be formed on the bank only to provide a nonuniform film.

Second Embodiment

Figure 3:
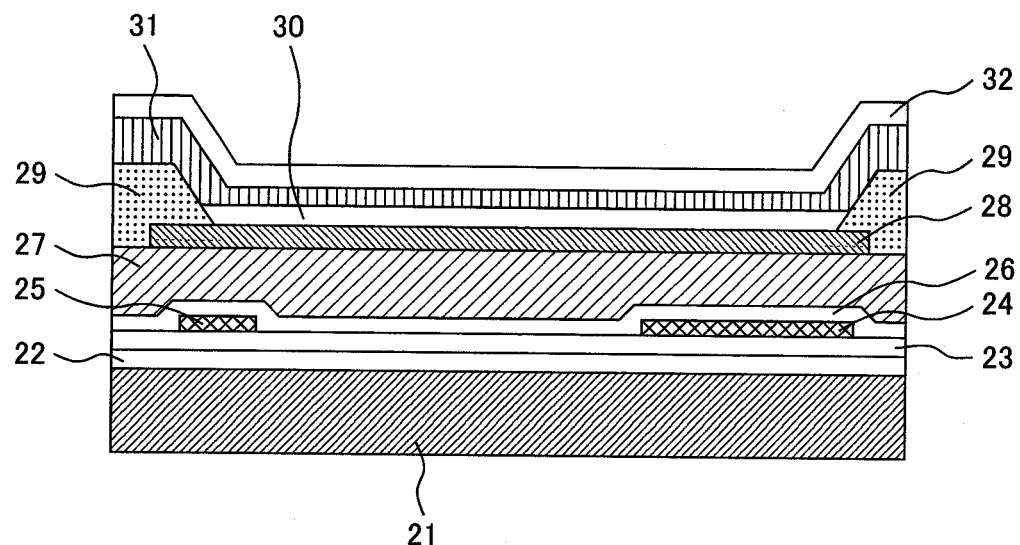
FIG. 3 is a cross-sectional view of a pixel of an organic electroluminescent display device in another embodiment according to the invention.

FIG. 3 shows a cross-sectional view of a structural example of a pixel of an organic electroluminescent display device with the so-called top emission structure. FIG. 3 differs from FIG. 1 in that the display device is configured to include a transparent electrode as the upper electrode and to take the emitted light from the upper transparent electrode side. FIG. 3 shows the structure in which a first interlayer insulating film 22, a second interlayer insulating film 23, a power line 24, an image signal line 25, a third interlayer insulating film 26, a planarizing layer 27, a lower electrode 28, a bank 29, an organic EL layer 30, an electron injection layer 31, and a transparent electrode (upper electrode) 32 are arranged over a glass substrate 21 in that order.

Figure 4:
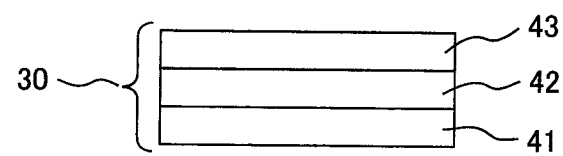
FIG. 4 is a cross-sectional view of an organic EL layer positioned at the center of the pixel of the organic electroluminescent display device in another embodiment according to the invention.

FIG. 4 is a cross-sectional view of the center of the pixel of the organic EL layer 30. The organic EL layer is composed of a hole injection layer 41, a hole transport layer 42, and an organic electroluminescent layer 43 in that order from the bottom.

In this embodiment, an Al/ITO laminated electrode is used as the lower electrode 28. Other materials for the lower electrode in use can be, for example, Cr, Ag, Al, or a laminated film of the above element and IZO. The lower electrode 28 is formed by processing the thin film by the photolithography or the like.

The bank 29 is made using various types of resins, such as polyimide resin, acryl resin, or the like, like the first embodiment. In this embodiment, the bank 29 is made of a photosensitive polyimide resin. The bank 29 can be formed by forming a coating film using resin, and by exposing and developing the film using a predetermined photomask. The water repellency process is applied to the surface of the bank. For example, the plasma process using fluorinated gas is applied to the surface of the bank to fluorinate the bank surface, causing the water repellent process.

The hole injection layer 41 in use can be made of polypyrrole material or triphenylamine polymer material or the like. In this embodiment, the material for the hole injection layer is poly(3,4-ethylene dioxythiophene) (PEDOT), or polystyrene sulfonate (PSS). The hole injection layer 41 is formed by the ink jet method. The water repellent process is applied to the surface of the bank, so that the hole injection layer can be provided only over the transparent electrode.

The hole transport layer 42 is comprised of polymer, crosslinking agent, and photopolymerization initiator. The polymers include various kinds of polymers, for example, an arylamine-based polymer, a polyfluorene-based polymer, a polyparaphenylene-based polymer, a polyarylene-based polymer, a polycarbazole-based polymer, and the like. The crosslinking agents include, for example, an oxetane-based compound, an epoxy-based compound, a vinyl ether-based compound, and the like. In this embodiment, the arylamine-based polymer is used as the polymer. The oxetane-based compound is used as the crosslinking agent. A sulfonium salt is used as the photopolymerization initiator.

A solution containing the above material is applied using an ink jet method to form the above hole transport layer. Since the water repellent process is applied to the surface of the bank, the hole transport layer can be formed only over the hole injection layer. The hole transport layer is subjected to irradiation of the light with a wavelength equal to or longer than that of a near-ultraviolet light to cause a polymerization reaction, and then becomes insoluble. The polymerization reaction can be performed by the light irradiation in the presence of air.

The organic electroluminescent layer 43 can be formed using polymers, such as a polyfluorene-based polymer, a polyparaphenylene-based polymer, a polyarylene-based polymer, or a polycarbazole-based polymer, or the so-called dendrimer type material having both functions of luminescent material and charge transport material. Further, the organic electroluminescent layer can be made using the so-called low-molecular material. In this case, a carbazole derivative, a fluorene derivative, or the like is preferably used as a host material.

Further, a dopant in use can be an Ir or Pt complex or the like. Such a dopant can be used to be dispersed into the above luminescent polymer. In this embodiment, a polyfluorene-based polymer is used as an organic electroluminescent layer.

Since the water repellency of the bank is also maintained in forming the above hole transport layer, the organic electroluminescent layer is formed using the solution by an ink jet method. As a result, the organic electroluminescent layer can be provided only over the hole transport layer.

The electron injection layer 31 is a layer for supplying electrons to the organic electroluminescent layer 43. Materials for the electron injection layer in use can be Ba, LiF, Ca, and a lamination thereof, a simple substance, such as a tris(8-quinolinolato) aluminum derivative, an oxadiazole derivative, a triazole derivative, a fullerene derivative, a phenanthroline derivative, or a quinoline derivative, and the material doped with alkali metal, a tetrathiafulvalene derivative, a pyrroline B, or the like. In this embodiment, the electron injection layer 31 is formed over the entire surface by a vacuum deposition method using barium as a material.

An In—Zn—O film (hereinafter abbreviated as an "IZO film") is used as the transparent electrode 32. Obviously, material for the In—Zn—O film is not limited to this material. The transparent electrode 32 may be any other electrode having the high optical transparency. The transparent electrode 32 may be a transparent electrode made of ITO, ZnO, or the like other than IZO, or a thin film electrode made of Cr, Ag, or the like.

Third Embodiment

Figure 5:
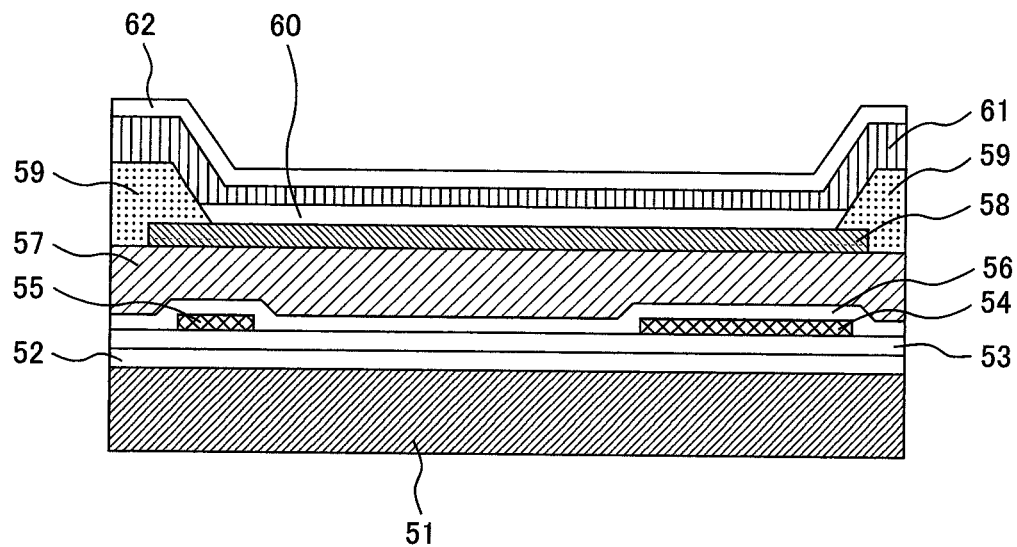
FIG. 5 is a cross-sectional view of a pixel of an organic electroluminescent display device in a further embodiment according to the invention.

FIG. 5 is a cross-sectional view showing a structural example of a pixel of the so-called top anode type organic electroluminescent display device with the top emission structure. FIG. 5 differs from FIG. 3 in that an upper transparent electrode is an anode electrode from which emitted light is taken. FIG. 5 shows an example of the structure in which a first interlayer insulating film 52, a second interlayer insulating film 53, a power line 54, an image signal line 55, a third interlayer insulating film 56, a planarizing layer 57, a lower electrode 58, a bank 59, an organic EL layer 60, a hole injection layer 61, and a transparent electrode 62 are arranged over a glass substrate 51 in that order.

Figure 6:
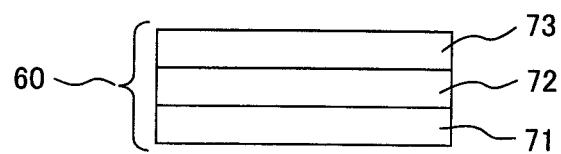
FIG. 6 is a cross-sectional view of an organic EL layer positioned at the center of the pixel of the organic electroluminescent display device in the further embodiment according to the invention.

FIG. 6 is a cross-sectional view of the center of the pixel of the organic EL layer 60. The organic EL layer is composed of an electron transport layer 71, an organic electroluminescent layer 72, and a hole transport layer 73 in that order from the bottom.

In this embodiment, an AlNi alloy is used for the lower electrode 58. Material for the lower electrode is not limited thereto, and Al, an AlNd alloy, an AlSi alloy, or an Al/ITO laminated film or the like can be used therefor. The lower electrode is formed by processing the above thin film by photolithography or the like.

The bank 59 is formed using various kinds of resins, such as a photosensitive polyimide resin, or acryl resin, like the first embodiment. In this embodiment, the photosensitive polyimide resin can be used therefor. The bank 59 can be formed by forming a coating film using the resin, and by exposing and developing the film using a predetermined photomask. The water repellency process is applied to the surface of the bank. For example, the plasma process using fluorinated gas is applied to the surface of the bank to fluorinate the bank surface, causing the water repellent process.

The electron transport layer 71 is preferably made of an oxide of Ti, Ce, Nd, Zr, or the like. In this embodiment, a titanium compound and lipophilic smectite are used therefor. The titanium compound is the so-called titania sol.

Specifically, the titanium compounds include, for example, tetra-i-propoxy titanium, tetra-n-butoxy titanium, tetrakis(2-ethylhexyl) titanium, tetra-heptadeca-oxy titanium, tetra-stearyl-oxy titanium, di-i-propoxy-bis(acetylacetonate) titanium, di-i-propoxy-bis(triethanolaminato) titanium, di-n-butoxy-bis(triethanolaminato) titanium, di-i-hydroxy-bis (carboxy methylmethoxy) titanium, tetrakis(1-n-propyl-2-ethylpropoxy)titanium, and the like.

The use of such materials can form the electron transport layer at low temperature.

The lipophilic smectites include a lipophilic smectite SAN, SAN316, STN, SEN, SPN, or the like manufactured by Co-op Chemical Co., Ltd. A silane coupling agent having an alkyl group (for example, hexatrimethoxysilane, decyltrimethoxysilane, phenyltrimethoxysilane, or the like) reacts with a hydrophilic smectite, so that the hydrophilic smectite can be converted into and used as the lipophilic one. A solution dissolving such a material therein is applied and heated at a temperature of about 100° C. Thus, titania zol is changed into a titanium oxide.

The organic electroluminescent layer 72 can be formed using polymers, such as a polyfluorene-based polymer, a polyparaphenylene-based polymer, a polyarylene-based polymer, or a polycarbazole-based polymer, or the so-called dendrimer type material having both functions of luminescent material and charge transport material. Further, the organic electroluminescent layer can be made using the so-called low-molecular material. In this case, a carbazole derivative, a fluorene derivative, or the like is preferably used as a host material. Further, a dopant in use can be an Ir or Pt complex or the like. Such a dopant can be used to be dispersed into the above luminescent polymer. In this embodiment, a polyfluorene polymer is used for the organic electroluminescent layer.

The organic electroluminescent layer is formed by applying a solution using an ink jet method. Since the temperature of curing in forming the above electron transport layer is low, the water repellency of the bank is maintained. Thus, the organic electroluminescent layer can be formed only over the electron transport layer.

The hole transport layer 73 is made using 4,4'-bis[N-(1-naphtyl)-N-phenylamino]biphenyl (α-NPD). The hole transport layer 73 is formed over the entire surface by vacuum deposition. Material used for the layer is not limited to the above ones, and may be N,N'-bis(3-methylphenyl)-N,N'-diphenyl-[1,1'-biphenyl]-4,4'-diamine (TPD), 4,4',4"-tri(N-carbazolyl)triphenylamine (TCTA), 1,3,5-tris[N-(4-diphenylaminophenyl)phenylamino]benzene (p-DPA-TDAB). It is apparent that the materials for the layer are not limited thereto, and other triphenylamine derivatives may be used. Alternatively, two or more kinds of these materials may be used.

The hole injection layer 61 is formed by co-evaporation using 4,4'-bis[N-(1-naphthyl)-N-phenylamino]biphenyl (α-NPD) as a hole transport material, and tetrafluoro-tetra-cyanoquinodimethane (F4-TCNQ) as a dopant. That is, the hole injection layer 61 is formed over the entire surface by vacuum deposition. Materials used for the layer are not limited to the above materials. The hole transport materials may include N,N'-bis(3-methylphenyl)-N,N'-diphenyl-[1,1'-biphenyl]-4,4'-diamine (TPD), 4,4',4"-tri(N-carbazolyl)triphenylamine (TCTA), 1,3,5-tris[N-(4-diphenylaminophenyl)phenylamino]benzene (p-DPA-TDAB). It is apparent that the materials for the layer are not limited thereto, and other triphenylamine derivatives may be used therefor. Alternatively, two or more kinds of these materials may be used therefor.

The dopant is not limited to the above F4-TCNQ, and a quinone compound or the like can be used for the dopant. Alternatively, not only the above-mentioned organic materials, but also inorganic materials, such as $V_2O_5$ or $MO_3$, can be used.

An In—Zn—O film (hereinafter abbreviated as an "IZO film") is used as the transparent electrode 62. Material for the In—Zn—O film is not limited to this material. The transparent electrode may be an electrode having the high optical transparency. The transparent electrode may be any other transparent electrode made of ITO, ZnO, or the like other than IZO, or a thin film electrode made of Cr, Ag, or the like.

INDUSTRIAL APPLICABILITY

The use of the present invention can easily fabricate an organic electroluminescent display device, and thus is applicable to display devices of a television or various types of information terminals or the like.

The invention claimed is:

1. An organic electroluminescent display device, comprising:
    a substrate;
    an organic electroluminescent layer;
    an upper electrode and a lower electrode sandwiching therein the organic electroluminescent layer, either one of said upper and lower electrodes being a transparent electrode, and the other being a reflecting electrode; and
    a charge transport layer disposed between the organic electroluminescent layer and the substrate,
    wherein the charge transport layer contains iodine and an oxide of at least one of cerium (Ce), neodymium (Nd), or zirconium (Zr).

2. An organic electroluminescent display device, comprising:
    a substrate;
    an organic electroluminescent layer;
    an upper electrode and a lower electrode sandwiching therein the or organic electroluminescent layer, either one of said upper and lower electrodes being a transparent electrode, and the other being a reflecting electrode; and
    a charge transport layer disposed between the organic electroluminescent layer and the substrate,
    wherein the charge transport layer contains a tosylate salt and an oxide of at least one of cerium (Ce), neodymium (Nd), or zirconium (Zr).

3. The organic electroluminescent display device according to claim 2, wherein the electroluminescent layer is isolated in each pixel by a bank layer having a water repellent surface.

4. An organic electroluminescent display device, comprising:
    a substrate;
    an organic electroluminescent layer;
    an upper electrode and a lower electrode sandwiching therein the organic electroluminescent layer, either one of said upper and lower electrodes being a transparent electrode, and the other being a reflecting electrode; and
    a charge transport layer disposed between the organic electroluminescent layer and the substrate,
    wherein the charge transport layer contains a tosylate salt, a titanium compound and a lipophilic smectite.

5. An organic electroluminescent display device, comprising:
    a substrate;
    an organic electroluminescent layer;
    an upper electrode and a lower electrode sandwiching therein the organic electroluminescent layer, either one of said upper and lower electrodes being a transparent electrode, and the other being a reflecting electrode; and
    a charge transport layer disposed between the organic electroluminescent layer and the substrate,
    wherein the charge transport layer contains iodine, a titanium compound and a lipophilic smectite.

* * * * *